United States Patent
Yokota et al.

(10) Patent No.: US 11,581,212 B2
(45) Date of Patent: Feb. 14, 2023

(54) PREPREG FOR CORELESS SUBSTRATE, CORELESS SUBSTRATE AND SEMICONDUCTOR PACKAGE

(71) Applicant: HITACHI CHEMICAL COMPANY, LTD., Tokyo (JP)

(72) Inventors: Hiroshi Yokota, Tokyo (JP); Shintaro Hashimoto, Tokyo (JP); Norihiko Sakamoto, Tokyo (JP); Shinji Tsuchikawa, Tokyo (JP); Katsuhiko Nawate, Tokyo (JP); Shin Takanezawa, Tokyo (JP)

(73) Assignee: Showa Denko Materials Co., Ltd., Tokyo (JP)

( * ) Notice: Subject to any disclaimer, the term of this patent is extended or adjusted under 35 U.S.C. 154(b) by 656 days.

(21) Appl. No.: 16/499,440

(22) PCT Filed: Mar. 28, 2018

(86) PCT No.: PCT/JP2018/012844
§ 371 (c)(1),
(2) Date: Oct. 25, 2019

(87) PCT Pub. No.: WO2018/181514
PCT Pub. Date: Oct. 4, 2018

(65) Prior Publication Data
US 2020/0056006 A1 Feb. 20, 2020

(30) Foreign Application Priority Data
Mar. 28, 2017 (JP) .............................. JP2017-063974

(51) Int. Cl.
*B32B 27/28* (2006.01)
*B32B 27/38* (2006.01)
*C08J 5/24* (2006.01)
*H01L 21/683* (2006.01)
*H01L 21/48* (2006.01)
*H01L 23/14* (2006.01)
*H01L 23/498* (2006.01)
*H05K 1/03* (2006.01)

(52) U.S. Cl.
CPC .......... *H01L 21/6835* (2013.01); *C08J 5/244* (2021.05); *C08J 5/249* (2021.05); *H01L 21/4857* (2013.01); *H01L 23/145* (2013.01); *H01L 23/49822* (2013.01); *H01L 23/49838* (2013.01); *C08J 2379/08* (2013.01); *C08J 2463/00* (2013.01); *C08J 2479/04* (2013.01); *H01L 2221/68345* (2013.01); *H01L 2221/68359* (2013.01)

(58) Field of Classification Search
None
See application file for complete search history.

(56) References Cited

U.S. PATENT DOCUMENTS

| 9,068,100 | B2 | 6/2015 | Endo et al. |
| 2008/0050596 | A1 | 2/2008 | Urakawa |
| 2012/0077401 | A1* | 3/2012 | Kotake ................. B32B 27/06 428/221 |
| 2013/0199832 | A1* | 8/2013 | Galster ............. H01L 23/49894 156/60 |
| 2015/0282302 | A1 | 10/2015 | Hoshi et al. |
| 2016/0289444 | A1 | 10/2016 | Verghese et al. |
| 2017/0042044 | A1* | 2/2017 | Miyamoto ............ H05K 3/4611 |

FOREIGN PATENT DOCUMENTS

| CN | 101910241 A | 12/2010 | |
| CN | 102079875 A * | 6/2011 | ............ C09J 163/00 |
| CN | 105647118 A | 6/2016 | |
| JP | 2002-026171 A | 1/2002 | |
| JP | 2005-072085 A | 3/2005 | |
| JP | 2009-231222 A | 10/2009 | |
| JP | 2015-189834 A | 11/2015 | |
| JP | 2015-224304 A | 12/2015 | |
| JP | 2016-190966 A | 11/2016 | |
| KR | 2016-0006248 A | 1/2016 | |
| TW | 201213112 A1 | 4/2012 | |
| WO | 2016/194927 A1 | 12/2016 | |

OTHER PUBLICATIONS

Machine translation of CN-102079875-A (no date).*

\* cited by examiner

*Primary Examiner* — Michael J Feely
(74) *Attorney, Agent, or Firm* — Fitch, Even, Tabin & Flannery, LLP (57) ABSTRACT

The present invention provides a prepreg for a coreless substrate and a coreless substrate and a semiconductor package using the prepreg, which can satisfy heat resistance, low thermal expansion, and bonding strength with a metal circuit at a level required for the coreless substrate. Specifically, the prepreg for a coreless substrate contains a thermosetting resin composition containing (a) dicyandiamide, (b) an adduct of a tertiary phosphine and quinones, (c) an amine compound having at least two primary amino groups, and (d) a maleimide compound having at least two primary amino groups having at least two N-substituted maleimide groups. Instead of (c) the amine compound having at least two primary amino groups and (d) the maleimide compound, having at least two N-substituted maleimide groups, (X) an amino-modified polyimide resin obtained by reacting them may be used.

12 Claims, 2 Drawing Sheets

Figure 1

Desmear Treatment Process

| Process | Temperature (°C) | Time (min) | Chemical Solution |
|---|---|---|---|
| Swelling | 70 | 5 | Swelling dip Secure Ligant P |
| Washing with water | room temperature | 2 | — |
| Roughening | 80 | 10 | Concentrate Compact CP |
| Washing with water | 50 | 2 | — |
| Neutralization | 40 | 5 | Reduction Solution Secure Ligant P500 |
| Washing with water | room temperature | 5 | — |

Figure 2

PREPREG FOR CORELESS SUBSTRATE, CORELESS SUBSTRATE AND SEMICONDUCTOR PACKAGE

CROSS-REFERENCE TO RELATED APPLICATIONS

This application is a U.S. national phase application filed under 35 U.S.C. § 371 of International Application No. PCT/JP2018/012844, filed Mar. 28, 2018, designating the United States, which claims priority from Japanese Patent Application No. 2017-063974, filed Mar. 28, 2017, which are hereby incorporated herein by reference in their entirety.

TECHNICAL FIELD

The present invention relates to a prepreg for a coreless substrate, and to a coreless substrate and a semiconductor package using the prepreg.

BACKGROUND ART

With recent miniaturization and high performance of electronic devices, printed wiring boards are required to have higher wiring density and higher integration and to have a thinner board.

As a package structure based on these requirements, for example, Patent Literature 1 and Patent Literature 2 propose a coreless substrate which does not have a core substrate and mainly includes a build-up layer capable of high-density wiring. The coreless substrate is obtained by forming a build-up layer on a support (core substrate) such as a metal plate and then removing the support (core substrate), that is, in this case, only the build-up layer. As the build-up layer used for forming the coreless substrate, a prepreg or the like obtained by impregnating a glass cloth with a resin composition is used.

Since the rigidity of the coreless substrate is lowered due to thinning caused by removing the support (core substrate), the problem that the semiconductor package warps when the semiconductor element is mounted and packaged becomes more conspicuous. The warpage is considered to be one of the factors that cause connection failure between the semiconductor element and the printed wiring board, and in the coreless substrate, a more effective reduction of the warpage is demanded.

One of the causes that warp the semiconductor package is the difference in the coefficient of thermal expansion between the semiconductor element and the printed wiring board. Generally, since the coefficient of thermal expansion of the printed wiring board is larger than the coefficient of thermal expansion of the semiconductor element, stress is generated by the thermal history or the like applied at the time of mounting the semiconductor element, and warpage occurs. Therefore, in order to suppress warpage of the semiconductor package, it is necessary to reduce the coefficient of thermal expansion of the printed wiring board to reduce the difference from the coefficient of thermal expansion of the semiconductor element, which is also applicable to the coreless substrate.

Patent Literature 3 discloses a method of laminating an insulating resin containing no glass cloth as an insulating layer on both sides of a prepreg, but this method tends to increase warpage because the coefficient of thermal expansion increases.

Here, it is generally known that the coefficient of thermal expansion of a prepreg obtained by impregnating a glass cloth with a resin composition follows the Scapery Equation represented by the following formula.

$$A \approx (A_r E_r F_r + A_g E_g F_g)/(E_r F_r + E_g F_g)$$

(In the formula, A represents a coefficient of thermal expansion of the prepreg, $A_r$ represents a coefficient of thermal expansion of the resin composition, $E_r$ represents an elastic modulus of the resin composition, $F_r$ represents a volume fraction of the resin composition, $A_g$ represents a coefficient of thermal expansion of the glass cloth, $E_g$ represents an elastic modulus of the glass cloth, and $F_g$ represents a volume fraction of the glass cloth.)

From the above Scapery Equation, it can be seen that when a glass cloth having the same physical property is used at a given volume fraction, the low thermal expansion of the prepreg can be achieved by reducing the elastic modulus and the coefficient of thermal expansion of the resin composition.

For example, Patent Literature 4 discloses a prepreg formed of a resin composition containing a specific low elasticity component and a woven fabric base material as a prepreg capable of reducing warpage of a semiconductor package.

CITATION LIST

Patent Literature

[Patent Literature 1] Japanese Patent Application Laid-Open No. 2005-72085
[Patent Literature 2] Japanese Patent Application Laid-Open No. 2002-26171
[Patent Literature 3] Japanese Patent Application Laid-Open No. 2009-231222
[Patent Literature 4] Japanese Patent Application Laid-Open No. 2015-189834

SUMMARY OF INVENTION

Technical Problem

However, in the prepreg in which the elastic modulus of the resin composition is reduced as shown in Patent Literature 4, the influence of the load applied to the build-up layer due to the decrease in rigidity is large, and for example, the metal circuit may peel off in the via hole forming step by a laser or the like after the build-up layer is formed. Therefore, improvement of the bonding strength with the metal circuit is required.

In view of these circumstances, an object of the present invention is to provide a prepreg for a coreless substrate, and a coreless substrate and a semiconductor package using the prepreg, which can satisfy heat resistance, low thermal expansion, and bonding strength with a metal circuit, of the level required for a coreless substrate.

Solution to Problem

As a result of extensive research to achieve the above object, the present inventors have found that the above problem can be solved by a prepreg comprising a thermosetting resin composition containing (a) dicyandiamide, (b) an adduct of a tertiary phosphine and quinones, (c) a specific amine compound, and (d) a specific maleimide compound, and that the prepreg is useful for a coreless substrate, and have reached the present invention.

That is, the present invention provides the following [1] to [7].

[1] A prepreg for a coreless substrate, including a thermosetting resin composition containing (a) dicyandiamide, (b) an adduct of a tertiary phosphine and quinones, (c) an amine compound having at least two primary amino groups, and (d) a maleimide compound having at least two N-substituted maleimide groups.

[2] A prepreg for a coreless substrate, including a thermosetting resin composition containing (a) dicyandiamide, (b) an adduct of a tertiary phosphine and quinones, and (X) an amino-modified polyimide resin, wherein the (X) amino-modified polyimide resin is a reaction product of (c) an amine compound having at least two primary amino groups in its molecular structure and (d) a maleimide compound having at least two N-substituted maleimide groups in its molecular structure.

[3] The prepreg for a coreless substrate according to the above [1] or [2], wherein a content of (a) the dicyandiamide is 0.05 to 1.5 parts by mass with respect to 100 parts by mass of a solid content of the resin component in the thermosetting resin composition.

[4] The prepreg for a coreless substrate according to any one of the above [1] to [3], wherein the thermosetting resin composition further contains at least one (e) thermosetting resin selected from the group consisting of an epoxy resin and a cyanate resin.

[5] The prepreg for a coreless substrate according to any one of the above [1] to [4], wherein the thermosetting resin composition further contains (f) an inorganic filler.

[6] A coreless substrate comprising an insulating layer formed using the prepreg for a coreless substrate according to any one of [1] to [5] above.

[7] A semiconductor package comprising a semiconductor element mounted on the coreless substrate described in [6] above.

Advantageous Effects of Invention

According to the present invention, it is possible to provide a prepreg for a coreless substrate, and a coreless substrate and a semiconductor package using the prepreg, which can satisfy the heat resistance, low thermal expansion, and bonding strength with a metal circuit of the level required for the coreless substrate. Further, by using the prepreg for a coreless substrate of the present invention, a substrate (coreless substrate) having a high flexural elastic modulus and excellent rigidity can be obtained even though it is thinned without a support (core substrate). Further, the desmear weight reduction amount can be suppressed to be small, and the desmear resistance is excellent.

DESCRIPTION OF EMBODIMENTS

In the numerical range described herein, the upper or lower limit of the numerical range may be replaced by the values shown in the embodiments. The lower limit value and the upper limit value of the numerical range are arbitrarily combined with the lower limit value and the upper limit value of the other numerical range, respectively.

Each of the components and materials exemplified in this specification may be used alone or in combination of two or more kinds unless otherwise specified. In the present specification, the content of each component in the composition means the total amount of a plurality of substances present in the composition when a plurality of substances corresponding to each component are present in the composition, unless otherwise specified.

Embodiments of any combination of the matters described in this specification are also included in the present invention.

[Prepreg for a Coreless Substrates]

The prepreg for a coreless substrate of the present invention (hereinafter, also simply referred to as "prepreg") is a prepreg including a thermosetting resin composition containing (a) dicyandiamide, (b) an adduct of a tertiary phosphine and quinones, (c) an amine compound having at least two primary amino groups, and (d) a maleimide compound having at least two N-substituted maleimide groups. Hereinafter, they are sometimes referred to as component (a), component (b), component (c), and component (d), respectively.

Since the prepreg of the present invention is excellent in heat resistance, low thermal expansion, and bonding strength with a metal circuit, it is particularly suitable for an application in which improvement of heat resistance, bonding strength with a metal circuit, warpage due to thinning and the like are required, as in the case of an insulating layer of a coreless substrate.

Hereinafter, each component contained in the thermosetting resin composition used for manufacturing the prepreg of the present invention will be described in order.

<(a) Dicyandiamide>

In the prepreg of the present invention, since the thermosetting resin composition contains (a) dicyandiamide together with the components (b) to (d) described later, even when the thermosetting resin composition is used for a coreless substrate, it is possible to improve the bonding strength with respect to a metal circuit while maintaining good heat resistance and low thermal expansion. The reason is not clear, but it is considered that the interaction between the polar group of dicyandiamide and the metal circuit is strongly affected.

The (a) dicyandiamide is represented by $H_2N-C(=NH)-NH-CN$ and has a melting point of usually 205 to 215° C., and, for higher purity, 207 to 212° C.

The (a) dicyandiamide is a crystalline substance, and may be a rhombic crystal or a plate crystal. The (a) dicyandiamide preferably has a purity of 98% or more, more preferably has a purity of 99% or more, and more preferably has a purity of 99.4% or more.

As the (a) dicyandiamide, a commercial product can be used. Commercial products include, for example, those manufactured by Wako Pure Chemical Industries, Ltd., Nippon Carbide Industries Co., Inc., Tokyo Chemical Industry Co., Ltd., Kishida Chemical Co., Ltd., and Nacalai Tesque, Inc.

The content of (a) dicyandiamide is preferably 0.05 to 1.5 parts by mass, more preferably 0.05 to 1.0 parts by mass, still more preferably 0.05 to 0.7 parts by mass, particularly preferably 0.08 to 0.7 parts by mass, and most preferably 0.1 to 0.5 parts by mass, with respect to 100 parts by mass of the solid content of the resin component in the curable resin composition. When it is 0.05 parts by mass or more, the effect of improving the bonding strength with the metal circuit tends to be sufficient. When the content is 1.5 parts by mass or less, the component (a) tends to suppress uneven dispersion of the component in the thermosetting resin composition, thereby improving electrical reliability of the prepreg.

In the above range, the lower limit of the content of (a) dicyandiamide may be 0.2 or 0.25.

Here, the solid content in the present embodiment means a component other than a volatile substance such as moisture, an organic solvent to be described later, or the like. That is, the solid content includes liquid, candy, and wax at room temperature around 25° C., and does not necessarily mean solid.

<(b) Adducts of Tertiary Phosphines and Quinones>

The thermosetting resin composition of the present invention contains (b) an adduct of a tertiary phosphine and quinones, whereby heat resistance and low thermal expansion are improved. The (b) adduct of a tertiary phosphine and quinones may be used alone or in combination of two or more kinds.

The tertiary phosphine which is a material constituting the component (b) is not particularly limited, and examples thereof include trialkylphosphine, tricycloalkylphosphine, triarylphosphine, monoalkyldiarylphosphine, dialkylmonoarylphosphine, and the like.

Examples of the trialkylphosphine include trimethylphosphine, tri(n-butyl)phosphine, triethylphosphine, and the like. The number of carbon atoms in the alkyl moiety of the trialkylphosphine is preferably 1 to 10, more preferably 2 to 8, and more preferably 2 to 5, respectively. As the trialkylphosphine, tri(n-butyl)phosphine is preferable.

Examples of the tricycloalkylphosphine include tricyclohexylphosphine and the like. The number of carbon atoms of the cycloalkyl moiety of the tricycloalkylphosphine is preferably 4 to 10, more preferably 5 to 8, respectively.

Examples of triarylphosphines include triphenylphosphine, tris(p-tolyl)phosphine, tris(4-ethylphenyl)phosphine, tris(4-propylphenyl)phosphine, tris(4-butylphenyl)phosphine, tris(isopropylphenyl)phosphine, tris(t-butylphenyl)phosphine, tris(2,4-dimethylphenyl)phosphine, tris(2,6-dimethylphenyl)phosphine, tris(2,4,6-trimethylphenyl)phosphine, tris(2,6-dimethyl-4-ethoxyphenyl)phosphine, tris(4-methoxyphenyl)phosphine, and tris(4-ethoxyphenyl)phosphine. The number of carbon atoms of the aryl moiety of the triarylphosphine is preferably 6 to 18, more preferably 6 to 12, and even more preferably 6 to 10, respectively. As the triarylphosphine, triphenylphosphine and tris(p-tolyl) phosphine are preferable.

Examples of the monoalkyldiarylphosphine include n-butyldiphenylphosphine, ethyldiphenylphosphine, and the like. The number of carbon atoms of the alkyl moiety of the monoalkyldiarylphosphine is preferably 1 to 10, more preferably 2 to 8, and even more preferably 2 to 5. The number of carbon atoms in the aryl moiety of the monoalkyldiarylphosphine is preferably 6 to 18, more preferably 6 to 12, and even more preferably 6 to 10, respectively.

The dialkyl monoarylphosphine includes, for example, di(n-butyl)phenylphosphine and the like. The alkyl moieties of the dialkyl monoaryl phosphine preferably have 1 to 10 carbon atoms, more preferably 2 to 8 carbon atoms, and more preferably 2 to 5 carbon atoms, respectively. The number of carbon atoms in the aryl moiety of the dialkyl monoaryl phosphine is preferably 6 to 18, more preferably 6 to 12, and even more preferably 6 to 10.

Examples of the quinones of the raw materials constituting the component (b) include benzoquinones such as o-benzoquinone and p-benzoquinone; diphenoquinone; naphthoquinone such as 1,4-naphthoquinone; and anthraquinone. Among these, benzoquinone is preferable from the viewpoints of moisture resistance and storage stability, and p-benzoquinone is more preferable.

The method of producing the component (b) is not particularly limited, and the component may be obtained by contacting a tertiary phosphine with quinones. For example, it may be produced by, for example, a method in which both of a tertiary phosphine and quinones are stirred and mixed in a solvent which dissolves both of them and brought into contact with each other. In this method, the temperature at the time of contacting is preferably from room temperature to 80° C. As the solvent, a solvent which the raw material is highly soluble in and the produced adduct is lowly soluble in (i.e., component (b)) is preferable, and ketones such as methyl isobutyl ketone, methyl ethyl ketone, and acetone are more preferable. Although the stirring time is not particularly limited, stirring for 1 to 12 hours is usually preferable.

As the (b) adduct of the tertiary phosphine and quinones, it is preferable to use a compound represented by the following general formula (b-1) from the viewpoint of heat resistance and low thermal expansion.

(b-1)

(In the general formula (b-1), $R^{b1}$ to $R^{b3}$ independently represents an organic group; $R^{b4}$ to $R^{b6}$ independently represents a hydrogen atom, an alkyl group having 1 to 12 carbon atoms, or an alkoxyl group having 1 to 12 carbon atoms; and $R^{b6}$ and $R^{b6}$ may be bonded to each other to form a ring.)

P in the general formula (b-1) is a phosphorus atom.

Examples of the organic group represented by the $R_{b1}$ to $R_{b3}$ in the general formula (b-1) include an alkyl group having 1 to 12 carbon atoms, an aryl group having 6 to 20 carbon atoms, an aralkyl group having 7 to 20 carbon atoms, and the like. The organic group is preferably an organic group containing no halogen atom.

Examples of the alkyl groups include a methyl group, an ethyl group, a n-propyl group, an isopropyl group, a n-butyl group, a s-butyl group, a t-butyl group, and a pentyl group. As the alkyl group, an alkyl group having 1 to 6 carbon atoms is preferable, an alkyl group having 3 to 6 carbon atoms is more preferable, and an n-butyl group is further preferable.

Examples of the aryl group include a phenyl group, a tolyl group, and a naphthyl group. As the aryl group, an aryl group having 6 to 12 carbon atoms is preferable, an aryl group having 6 to 10 carbon atoms is more preferable, and a phenyl group or a tolyl group is more preferable. Examples of the tolyl group include an o-tolyl group, an m-tolyl group, and a p-tolyl group, and among them, a p-tolyl group is preferable.

Examples of the aralkyl group include a benzyl group, a phenethyl group, and the like. As the aralkyl group, an aralkyl group having 7 to 10 carbon atoms is preferable, and a benzyl group is more preferable.

Among the above, as the organic group represented by $R_{b1}$ to $R_{b3}$, an alkyl group having 1 to 12 carbon atoms, and an aryl group having 6 to 20 carbon atoms are preferable, an alkyl group having 1 to 12 carbon atoms which does not contain halogen atoms, and an aryl group having 6 to 20 carbon atoms which does not contain halogen atoms are more preferable.

The $R^{b1}$ to $R^{b3}$ may be all the same, may be different, or may be all different, but preferably all the same.

The alkyl group having 1 to 12 carbon atoms represented by $R^{b4}$ to $R^{b6}$ in the general formula (b-1) includes the same alkyl group as those represented by the above $R^{b1}$ to $R^{b3}$. Among them, an alkyl group having 1 to 6 carbon atoms is preferable, and an alkyl group having 1 to 3 carbon atoms is more preferable.

The alkoxy groups having 1 to 12 carbon atoms represented by $R^{b4}$ to $R^{b6}$ in the general formula (b-1) include methoxy groups, ethoxy groups, n-propoxy groups, iso-propoxy groups, n-butoxy groups, and t-butoxy groups. Among these, an alkoxyl group having 1 to 6 carbon atoms is preferable, and an alkoxyl group having 1 to 3 carbon atoms is more preferable.

The $R^{b5}$ and the $R^{b6}$ may be bonded to each other to form a ring, and examples of the ring include a benzene ring and the like.

The $R^{b4}$ to $R^{b6}$ in the general formula (b-1) may be the same, may be different, or may be all different, but preferably all of them are the same, and more preferably all of them are hydrogen atoms.

From the above, it is preferable that the compound represented by the general formula (b-1) is a compound represented by the following general formula (b-2).

(b-2)

(In the general formula (b-2), the $R^{b1}$ to $R^{b3}$ is the same as in the general formula (b-1), and the preferred one is the same.)

Specific examples of the component (b) include, for example, an adduct of triphenylphosphine and p-benzoquinone, an adduct of tri(p-tolyl)phosphine and p-benzoquinone, an adduct of tri(n-butyl)phosphine and p-benzoquinone, and the like. In particular, the adducts of triphenylphosphine and p-benzoquinone, tri(p-tolyl)phosphine and p-benzoquinone are preferably used from the viewpoint of storage stability, and the adducts of tri(n-butyl)phosphine and p-benzoquinone are preferably used from the standpoint of solubility in a solvent.

The content of the component (b) is preferably 0.05 to 2 parts by mass, more preferably 0.1 to 1 part by mass, still more preferably 0.1 to 0.7 parts by mass, and particularly preferably 0.1 to 0.5 parts by mass with respect to 100 parts by mass of the solid content of the resin component in the thermosetting resin composition. Use in this range tends to improve heat resistance and low thermal expansion.

<(c) Amine Compound Having at Least Two Primary Amino Groups>

The thermosetting resin composition of the present invention contains (c) an amine compound having at least two primary amino groups, thereby improving the low thermal expansion and the bonding strength with the metal circuit.

As the component (c), one component may be used alone or in combination of two or more kinds.

The (c) amine compound is not particularly limited as long as it is an amine compound having at least two primary amino groups.

As the (c) amine compound, an amine compound having two primary amino groups is preferable, and a diamine compound represented by the following general formula (c-1) is more preferable.

$$H_2N-X^{c1}-NH_2 \quad (c\text{-}1)$$

(In the general formula (c-1), $X^{c1}$ is a group represented by the following general formula (c1-1), (c1-2), or (c1-3);

(c1-1)

(In the general formula (c1-1), $R^{c1}$ is independently an aliphatic hydrocarbon group having 1 to 5 carbon atoms or a halogen atom; and p is an integer of 0 to 4.)

(c1-2)

(In the general formula (c1-2), $R^{c2}$ and $R^{c3}$ are each independently an aliphatic hydrocarbon group having 1 to 5 carbon atoms or a halogen atom; $X^{c2}$ is an alkylene group having 1 to 5 carbon atoms, an alkylidene group having 2 to 5 carbon atoms, an ether group, a sulfide group, a sulfonyl group, a carbonyloxy group, a keto group, a single bond, or a group represented by the following general formula (c1-2-1); and q and r are each independently an integer of 0 to 4.)

(c1-2-1)

(In the general formula (c1-2-1), $R^{c4}$ and $R^{c5}$ are each independently an aliphatic hydrocarbon group having 1 to 5 carbon atoms or a halogen atom; $X^{c3}$ is an alkylene group having 1 to 5 carbon atoms, an alkylidene group having 2 to 5 carbon atoms, an ether group, a sulfide group, a sulfonyl group, a carbonyloxy group, a keto group, or a single bond; and s and t are each independently an integer of 0 to 4.)

(c1-3)

(In the general formula (c1-3), $R^{c6}$, $R^{c7}$, $R^{c8}$ and $R^{c9}$ each independently represent an alkyl group, a phenyl group, or a substituted phenyl group having 1 to 5 carbon atoms; $X^{c4}$ and $X^{c5}$ each independently represent a divalent organic group; and u is an integer of 2 to 100.)

In the general formula (c1-1), examples of the aliphatic hydrocarbon group represented by Rd include a methyl group, an ethyl group, a n-propyl group, an isopropyl group, a n-butyl group, an isobutyl group, a t-butyl group, a n-pentyl group, and the like. The aliphatic hydrocarbon group is preferably an aliphatic hydrocarbon group having 1 to 3 carbon atoms, more preferably a methyl group. Also, examples of the halogen atom include fluorine atom, chlorine atom, bromine atom, iodine atom, and the like.

Among the above, an aliphatic hydrocarbon group having 1 to 5 carbon atoms is preferable as the $R^{c1}$.

p is an integer of 0 to 4, and is preferably an integer of 0 to 2, more preferably 2, from the viewpoint of availability. When p is an integer of 2 or more, a plurality of $R^{c1}$ may be the same or different from each other.

The aliphatic hydrocarbon group having 1 to 5 carbon atoms and the halogen atom represented by $R^{c2}$ and $R^{c3}$ in the above general formula (c1-2) may be the same as those of the above $R^{c1}$. The aliphatic hydrocarbon group is preferably an aliphatic hydrocarbon group having 1 to 3 carbon atoms, more preferably a methyl group and an ethyl group, and more preferably an ethyl group.

Alkylene groups having 1 to 5 carbon atoms represented by $X^{c2}$ include, for example, a methylene group, a 1,2-dimethylene group, a 1,3-trimethylene group, a 1,4-tetramethylene group, and a 1,5-pentamethylene group. The alkylene group is preferably an alkylene group having 1 to 3 carbon atoms from the viewpoint of heat resistance and low thermal expansion, and more preferably a methylene group.

Examples of the alkylidene group having 2 to 5 carbons represented by $X^{c2}$ include an ethylidene group, a propylidene group, an isopropylidene group, a butylidene group, an isobutylidene group, a pentylidene group, an isopentylidene group, and the like. Among these, an isopropylidene group is preferable from the viewpoints of heat resistance and low thermal expansion.

Among the above-mentioned options, an alkylene group having 1 to 5 carbon atoms and an alkylidene group having 2 to 5 carbon atoms are preferable as the $X^{c2}$. More preferable are as described above.

q and r are each independently integers of 0 to 4, and from the viewpoint of availability, both are preferably integers of 0 to 2, more preferably 0 or 2. When q or r is an integer of 2 or more, a plurality of $R^{c2}$ or $R^{c3}$ may be the same or different from each other.

The aliphatic hydrocarbon group having 1 to 5 carbon atoms and the halogen atom represented by $R^{c4}$ and $R^{c5}$ in the general formula (c1-2-1) include the same as those of the $R^{c2}$ and the $R^{c3}$, and the preferred aliphatic hydrocarbon groups and preferred halogen atoms are also the same as preferred those of the $R^{c2}$ and the $R^{c3}$.

As the alkylene group having 1 to 5 carbon atoms and the alkylidene group having 2 to 5 carbon atoms represented by $X^{c3}$, the same as the alkylene group having 1 to 5 carbon atoms and the same as the alkylidene group having 2 to 5 carbon atoms represented by $X^{c2}$ are mentioned, and the preferred alkylene groups and preferred alkylidene groups of $X^{c3}$ are also the same as preferred those of the $X^{c2}$.

Among the above options, $X^{c3}$ is preferably an alkylidene group having 2 to 5 carbons, and more preferably an isopropylidene group.

The s and t are integers of 0 to 4, and from the viewpoint of availability, both are preferably integers of 0 to 2, more preferably 0 or 1, and even more preferably 0. When s or t is an integer of 2 or more, a plurality of $R^{c4}$ or $R^{c5}$ may be the same or different from each other.

The general formula (c1-2-1) is preferably represented by the following general formula (c1-2-1').

(c1-2-1')

($X^{c3}$, $R^{c4}$, $R^{c5}$, s and t in the general formula (c1-2-1') are the same as those in the general formula (c1-2-1), and the preferred ones are the same.)

The group represented by the general formula (c1-2) is preferably a group represented by the following general formula (c1-2'), more preferably a group represented by any one of the following general formulae (c1-i) to (c1-iii), and more preferably a group represented by the following general formula (c1-ii) or (c1-iii).

(c1-2')

($X^{c2}$, $R^{c2}$, $R^{c3}$, q and r in the general formula (c1-2) are the same as those in the general formula (c1-2), and the preferred ones are the same.)

(c1-i)

(c1-ii)

(c1-iii)

Examples of the alkyl group having 1 to 5 carbon atoms represented by $R^{c6}$, $R^{c7}$, $R^{c8}$, and $R^{c9}$ in the general formula (c1-3) include a methyl group, an ethyl group, a n-propyl group, an isopropyl group, a n-butyl group, an isobutyl group, a t-butyl group, a n-pentyl group, and the like. As the alkyl group, an alkyl group having 1 to 3 carbon atoms is preferable, and a methyl group is more preferable.

Examples of the substituent of the phenyl group in the substituted phenyl group include an alkyl group having 1 to 5 carbon atoms, an alkenyl group having 2 to 5 carbon atoms, an alkynyl group having 2 to 5 carbon atoms, and the like. Examples of the alkyl group having 1 to 5 carbon atoms include the same alkyl groups as those described above. Examples of the alkenyl group having 2 to 5 carbon atoms include a vinyl group, an allyl group, and the like. Examples of the alkynyl group having 2 to 5 carbon atoms include an ethynyl group, a propargyl group, and the like.

$R^{c6}$, $R^{c7}$, $R^{c8}$ and $R^{c9}$ are all preferably alkyl groups having 1 to 5 carbons, and more preferably methyl groups.

Examples of divalent organic groups represented by $X^{c4}$ and $X^{c5}$ include an alkylene group, an alkenylene group, an alkynylene group, an arylene group, and —O—, or a divalent linking group formed by combining these groups. Examples of the alkylene group include an alkylene group having 1 to 10 carbon atoms such as a methylene group, an ethylene group, and a propylene group. Examples of the alkenylene group include an alkenylene group having 2 to 10 carbon atoms. Examples of the alkynylene group include an alkynylene group having 2 to 10 carbon atoms. Examples of the arylene group include an arylene group having 6 to 20 carbon atoms, such as a phenylene group or a naphthylene group.

In the general formula (c-1), the $X^{c1}$ may be any of the groups represented by the general formula (c1-1), (c1-2) or (c1-3), and among these, the group represented by the general formula (c1-3) is preferable from the viewpoint of low thermal expansion and bonding strength with metallic circuits.

Specific examples of the component (c) include diaminobenzidine, diaminodiphenylmethane, diaminodiphenyl ether, diaminodiphenyl sulfone, 3,3'-dichloro-4,4'-diaminobiphenyl, 3,3'-dimethoxy-4,4'-diaminobiphenyl, 3,3'-dimethyl-4,4'-diaminobiphenyl, 3,3'-dimethyl-4,4'-diaminobiphenyl-6,6'-disulfonic acid, 2,2',5,5'-tetrachloro-4,4'-diaminobiphenyl, 4,4'-methylen-bis(2-chloroaniline), 1,3'-bis(4-aminophenoxy)benzene, 2,2'-bis[4-(4-aminophenoxy)phenyl]propane, bis[4-(4-aminophenoxy)phenyl]sulfone, bis[4-(3-aminophenoxy)phenyl]sulfone, 4,4'-bis(4-aminophenoxy)biphenyl, 2,2'-bis[4-(4-aminophenoxy)phenyl]hexafluoropropane, 1,4'-bis(4-aminophenoxy)benzene, 4,4'-diaminodiphenyl sulfide, 2,2'-dimethyl-4,4'-diaminobiphenyl, 4,4'-diamino-3,3'-biphenyldiol, 9,9'-bis(4-aminophenyl)fluorene, o-tridinesulfone, a modified siloxane compound with a primary amino group at its molecular end. Among these, from the viewpoints of heat resistance, low thermal expansion, and bonding strength with a metal circuit, a modified siloxane compound having a primary amino group at the molecular end is preferable, and a modified siloxane compound having a primary amino group at both ends of the molecule is more preferable.

Examples of the modified siloxane compound having a primary amino group at its molecular end include a compound in which the $X^{c1}$ in the general formula (c-1) is a group represented by the general formula (c1-3), and the like.

As the modified siloxane compound having a primary amino group at its molecular end, commercially available products may be used. Examples of the commercially available products include a modified siloxane compound having a primary amino group at both ends of the molecule (hereinafter, also referred to as "both-terminal diamine-modified siloxane"), such as "PAM-E" (functional group equivalent of amino group: 130 g/mol), "KF-8010" (functional group equivalent of amino group: 430 g/mol), "X-22-161A" (functional group equivalent of amino group: 800 g/mol), "X-22-161B" (functional group equivalent of amino group: 1,500 g/mol), "KF-8012" (functional group equivalent of amino group: 2,200 g/mol), and "KF-8008" (functional group equivalent of amino group: 5,700 g/mol) (all manufactured by Shin-Etsu Chemical Co., Ltd), "BY16-871" (functional group equivalent of amino group: 130 g/mol) and "BY16-853U" (functional group equivalent of amino group: 460 g/mol) (all manufactured by Dow Corning Toray Co. Ltd), and the like. Among them, "X-22-161A" and "X-22-161B" are preferable from the viewpoint of high reactivity and lower thermal expansion.

There is no particular limitation on the functional group equivalent of the amino group of the modified siloxane compound having a primary amino group at the molecular end, but 300 to 3,000 g/mol is preferable, 400 to 2,500 g/mol is more preferable, and 600 to 2,000 g/mol is more preferable.

The content of the component (c) is preferably 3 to 50 parts by mass, more preferably 5 to 30 parts by mass, and still more preferably 10 to 25 parts by mass with respect to 100 parts by mass of the solid content of the resin component in the thermosetting resin composition from the viewpoint of low thermal expansion and bonding strength with the metal circuit.

<(d) Maleimide Compound Having at Least Two N-Substituted Maleimide Groups>

The thermosetting resin composition of the present invention contains (d) a maleimide compound having at least two N-substituted maleimide groups, thereby improving low thermal expansion and flexural modulus.

The component (d) is not particularly limited as long as it is a maleimide compound having at least two N-substituted maleimide groups.

As the component (d), a maleimide compound having two N-substituted maleimide groups is preferable, and a compound represented by the following general formula (d-1) is more preferable.

(d-1)

(In the general formula (d-1), $X^{d1}$ is a group represented by the general formula (d1-1), (d1-2), (d1-3), or (d1-4):

(d1-1)

(In the general formula (d1-1), $R^{d1}$ is independently an aliphatic hydrocarbon group having 1 to 5 carbon atoms or a halogen atom, and p1 is an integer of 0 to 4.)

(d1-2)

(In the general formula (d1-2), $R^{d2}$ and $R^{d3}$ are each independently an aliphatic hydrocarbon group having 1 to 5 carbon atoms or a halogen atom; $X^{d2}$ is an alkylene group having 1 to 5 carbon atoms, an alkylidene group having 2 to 5 carbon atoms, an ether group, a sulfide group, a sulfonyl group, a carbonyloxy group, a keto group, a single bond, or a group represented by the following general formula (d1-2-1); q1 and r1 are each independently an integer of 0 to 4.)

(d1-2-1)

(In the general formula (d1-2-1), $R^{d4}$ and $R^{d5}$ are each independently an aliphatic hydrocarbon group having 1 to 5 carbon atoms or a halogen atom; $X^{d3}$ is an alkylene group having 1 to 5 carbon atoms, an alkylidene group having 2 to 5 carbon atoms, an ether group, a sulfide group, a sulfonyl group, a carbonyloxy group, a keto group, or a single bond; s1 and t1 are each independently an integer of 0 to 4.)

(d1-3)

(In the general formula (d1-3), n1 is an integer of 1 to 10.)

(d1-4)

(In the general formula (d1-4), $R^{d6}$ and $R^{d7}$ each independently represent a hydrogen atom or an aliphatic hydrocarbon group having 1 to 5 carbon atoms, and u1 is an integer of 1 to 8.)

In the general formula (d1-1), for example, the aliphatic hydrocarbon groups represented by $R^{d1}$ include a methyl group, an ethyl group, a n-propyl group, an isopropyl group, a n-butyl group, an isobutyl group, a t-butyl group, and a n-pentyl group. The aliphatic hydrocarbon group is preferably an aliphatic hydrocarbon group having 1 to 3 carbon atoms, more preferably a methyl group. Also, examples of the halogen atom include fluorine atom, chlorine atom, bromine atom, iodine atom, and the like.

Among the above, an aliphatic hydrocarbon group having 1 to 5 carbon atoms is preferable as the $R^{d1}$.

p1 is an integer of 0 to 4, and is preferably an integer of 0 to 2, more preferably 0 or 1, and even more preferably 0 from the viewpoint of availability. When p1 is an integer of 2 or more, a plurality of $R^{d1}$ may be the same or different from each other.

The aliphatic hydrocarbon group having 1 to 5 carbon atoms and the halogen atom represented by $R^{d2}$ and $R^{d3}$ in the above general formula (d1-2) may be the same as those of the above $R^{d1}$. The aliphatic hydrocarbon group is preferably an aliphatic hydrocarbon group having 1 to 3 carbon atoms, more preferably a methyl group and an ethyl group, and more preferably an ethyl group.

Examples of the alkylene groups having 1 to 5 carbon atoms represented by $X^{d2}$ include a methylene group, a 1,2-dimethylene group, a 1,3-trimethylene group, a 1,4-tetramethylene group, and a 1,5-pentamethylene group. The alkylene group is preferably an alkylene group having 1 to 3 carbon atoms from the viewpoint of heat resistance and low thermal expansion, and more preferably a methylene group.

Examples of the alkylidene group having 2 to 5 carbon atoms represented by $X^{d2}$ include an ethylidene group, a propylidene group, an isopropylidene group, a butylidene group, an isobutylidene group, a pentylidene group, an isopentylidene group, and the like. Among these, an isopropylidene group is preferable from the viewpoints of heat resistance and low thermal expansion.

Among the above-mentioned options, an alkylene group having 1 to 5 carbon atoms and an alkylidene group having 2 to 5 carbon atoms are preferable as the $X^{d2}$. More preferable are as described above.

Each of q1 and r1 is independently an integer of 0 to 4, and from the viewpoint of availability, any of q1 and r1 is preferably an integer of 0 to 2, more preferably 0 or 2. When q1 or r1 is an integer of 2 or more, a plurality of $R^{d2}$ or $R^{d3}$ may be the same or different from each other.

The aliphatic hydrocarbon group having 1 to 5 carbon atoms and the halogen atom represented by $R^{d4}$ and $R^{d5}$ in the general formula (d1-2-1) include the same as those in the $R^{d2}$ and the $R^{d3}$, and the preferred group is also the same as preferred those of the $R^{d2}$ and the $R^{d3}$.

As the alkylene group having 1 to 5 carbon atoms and the alkylidene group having 2 to 5 carbon atoms represented by $X^{d3}$, the same as the alkylene group having 1 to 5 carbon atoms and the same as the alkylidene group having 2 to 5 carbon atoms represented by $X^{d2}$ are mentioned, and the preferred alkylene groups and preferred alkylidene groups of $X^{d3}$ are also the same as preferred those of the $X^{d2}$.

Among the above options, $X^{d3}$ is preferably an alkylidene group having 2 to 5 carbons, and more preferable alkylidene groups are as described above.

The values s1 and t1 are integers of 0 to 4, and from the viewpoint of availability, both are preferably integers of 0 to 2, more preferably 0 or 1, and even more preferably 0. When s1 or t1 is an integer of 2 or more, a plurality of $R^{d4}$ or $R^{d5}$ may be the same or different from each other.

The general formula (d1-2-1) is preferably represented by the following general formula (d1-2-1').

(d1-2-1')

($X^{d3}$, $R^{d4}$, $R^{d5}$, s1 and t1 in the general formula (d1-2-1') are the same as those in the general formula (d1-2-1), and the preferred ones are the same.)

The group represented by the general formula (d1-2) is preferably a group represented by the general formula (d1-2'), more preferably a group represented by any one of the following (d1-i) to (d1-iii), and more preferably a group represented by the following (d1-i).

($X^{d2}$, $R^{d2}$, $R^{d3}$, q1 and r1 in the general formula (d1-2') are the same as those in the general formula (d1-2), and the preferred ones are the same.)

In the above d1-3, n1 is an integer of 1 to 10, and is preferably 1 to 5, more preferably 1 to 3 from the viewpoint of availability.

In the above general formula (d1-4), aliphatic hydrocarbon groups having 1 to 5 carbon atoms represented by $R^{d6}$ and $R^{d7}$ include the same aliphatic hydrocarbon groups as those represented by $R^{d1}$ in the above general formula (d1-1), and preferable aliphatic hydrocarbon groups are also the same as those represented by $R^{d1}$ in the above general formula (d1-1). u1 is an integer of 1 to 8, preferably an integer of 1 to 3, more preferably 1.

In the general formula (d-1), $X^{d1}$ may be any of the groups represented by the general formula (d1-1), (d1-2), (d1-3) or (d1-4), and among these, it is preferable to be a group represented by (d1-2) from the viewpoint of low thermal expansion and flexural modulus.

Specific examples of the component (d) include, for example, bis(4-maleimidophenyl)methane, polyphenylmethane maleimide, bis(4-maleimidophenyl)ether, bis(4-maleimidophenyl)sulfone, 3,3'-dimethyl-5,5'-diethyl-4,4'-diphenylmethane bismaleimide, 4-methyl-1,3-phenylenebismaleimide, m-phenylenebismaleimide, 2,2-bis[4-(4-maleimidophenoxy)phenyl]propane, and the like.

Among these, bis(4-maleimidophenyl)methane, bis(4-maleimidophenyl)sulfone, 3,3'-dimethyl-5,5'-diethyl-4,4'-diphenylmethane bismaleimide, and 2,2-bis[4-(4-maleimidophenoxy)phenyl]propane are preferable from the viewpoint of high reactivity and high heat resistance, and 3,3'-dimethyl-5,5'-diethyl-4,4'-diphenylmethane bismaleimide and bis(4-maleimidophenyl)methane are more preferable from the standpoint of solubility in organic solvents, and bis(4-maleimidophenyl)methane are more preferable from the standpoint of manufacturing cost.

The content of the component (d) is preferably 20 to 90 parts by mass, more preferably 40 to 85 parts by mass, and still more preferably 55 to 85 parts by mass with respect to 100 parts by mass of the solid content of the resin component in the thermosetting resin composition from the viewpoint of the flexural modulus and the low thermal expansion.

The components (c) and (d) may be mixed with the components (a) and (b) and the like as they are, or the components (c) and (d) may be heated and reacted with each other to form an amino-modified polyimide resin (hereinafter, referred to as (X) an amino-modified polyimide resin) in advance, if necessary, before mixing with the components (a) and (b). That is, the present invention also provides a prepreg for a coreless substrate including a thermosetting resin containing (a) a dicyandiamide, (b) an adduct of a tertiary phosphine and quinones, and (X) an amino-modified polyimide resin which is a reaction product of (c) an amine compound having at least two primary amino groups in its molecular structure and (d) a maleimide compound having at least two N-substituted maleimide groups in its molecular structure, and is preferably a prepreg for the coreless substrate. When the component (c) and the component (d) are reacted in advance to form the (X) amino-modified polyimide resin, the molecular weight can be controlled, and moreover, the low curing shrinkage property and the low thermal expansion property can be improved.

The (X) amino-modified polyimide resin will be described below.

<(X) Amino-Modified Polyimide Resin>

There is no particular limitation on the reaction method of the component (c) with the component (d). The reaction temperature is preferably from 70 to 200° C., more preferably from 80 to 150° C., and more preferably from 100 to 130° C., from the viewpoint of productivity and sufficient reaction progress. The reaction time is not particularly limited, but the reaction time is preferably 0.5 to 10 hours, and more preferably 1 to 6 hours.

The reaction of the component (c) with the component (d) is preferably carried out in an organic solvent. Examples of the organic solvent include alcoholic solvents such as ethanol, propanol, butanol, methyl cellosolve, butyl cellosolve, propylene glycol monomethyl ether and the like; ketone solvents such as acetone, methyl ethyl ketone, methyl isobutyl ketone, cyclohexanone, and the like; ester solvents such as ethyl acetate, γ-butyrolactone, and the like; ether solvents such as tetrahydrofuran and the like; aromatic solvents such as toluene, xylene, mesitylene, and the like; nitrogen atom-containing solvents such as dimethylformamide, dimethylacetamide, N-methylpyrrolidone, and the like; sulfur atom-containing solvents such as dimethyl sulfoxide and the like. These may be used alone or in combination of two or more kinds.

Among these, cyclohexanone, propylene glycol monomethyl ether, methyl cellosolve, γ-butyrolactone are preferable from the viewpoint of solubility, and cyclohexanone, propylene glycol monomethyl ether, dimethylacetamide are preferable and propylene glycol monomethyl ether is more preferable from the viewpoint of low toxicity and high volatility and difficulty in remaining as a residual solvent.

There is no particular limitation on the amount of the organic solvent used, but from the viewpoint of solubility and reaction rate, 25 to 1,000 parts by mass, more preferably 50 to 500 parts by mass, and still more preferably 50 to 200 parts by mass with respect to the total 100 parts by mass of the component (c) and the component (d).

After completion of the above reaction, the obtained reaction mixture can be mixed with other components as it is without purification of the reaction product in particular to prepare a thermosetting resin composition containing (X) an amino-modified polyimide resin.

In the above reaction, the use ratio of the component (c) and the component (d) is preferably one in which the equivalent of the maleimide group of the component (d) exceeds the equivalent of the primary amino group of the component (c), that is, one in which the ratio [(d)/(c)] of the equivalent of the maleimide group of the component (d) and the equivalent of the primary amino group of the component (c) exceeds 1, more preferably 2 to 35, and still more preferably 10 to 35, from the viewpoint of prevention of gelation and heat resistance.

When the thermosetting resin composition contains the (X) amino-modified polyimide resin, the content thereof is preferably 60 to 95 parts by mass, more preferably 70 to 95 parts by mass, and still more preferably 80 to 95 parts by mass with respect to 100 parts by mass of the solid content of the resin component in the thermosetting resin composition.

<(e) Thermosetting Resin>

The thermosetting resin composition may further contain, and preferably contains, (e) a thermosetting resin. However, the thermosetting resin (e) does not contain the component (c) and the component (d). As the (e) thermosetting resin, one kind may be used alone or two or more kinds may be used in combination.

Examples of the (e) thermosetting resin include an epoxy resin, a phenolic resin, an unsaturated imide resin (excluding the component (d)), a cyanate resin, an isocyanate resin, a benzoxazine resin, an oxetane resin, and an amino resin (excluding the component (c)), an unsaturated polyester resin, an allyl resin, a dicyclopentadiene resin, a silicone resin, a triazine resin, and a melamine resin (excluding the component (c)). Among these, one or more selected from the group consisting of an epoxy resin and a cyanate resin is preferable from the viewpoints of moldability and electrical insulating properties, and bonding strength with a metal circuit, and an epoxy resin is more preferable.

Examples of the epoxy resin include a bisphenol A type epoxy resin, a bisphenol F type epoxy resin, a bisphenol S type epoxy resin, a phenol novolac type epoxy resin, a cresol novolac type epoxy resin, an α-naphthol/cresol novolac type epoxy resin, a bisphenol A novolac type epoxy resin, a bisphenol F novolac type epoxy resin, a stilbene type epoxy resin, an epoxy resin containing a triazine skeleton, an epoxy resin containing a fluorene skeleton, a triphenol methane type epoxy resin, a biphenyl type epoxy resin, a xylene type epoxy resin, a biphenyl aralkyl novolac type epoxy resin, a naphthalene type epoxy resin, a dicyclopentadiene type epoxy resins, a cycloaliphatic epoxy resins, a polyfunctional phenol, a polycyclic aromatic diglycidyl ether compound such as anthracene, and a phosphorus-containing epoxy resin thereof into which a phosphorus compound are introduced. These may be used alone or in combination of two or more kinds. Among these, a biphenyl aralkyl novolac type epoxy resin and an α-naphthol/cresol novolac type epoxy resin are preferable from the viewpoints of heat resistance and flame retardancy.

When the thermosetting resin composition contains the (e) thermosetting resin, the content thereof is preferably 1 to 30 parts by mass, more preferably 3 to 20 parts by mass, and still more preferably 5 to 15 parts by mass with respect to 100 parts by mass of the solid content of the resin component in the thermosetting resin composition.

<(f) Inorganic Filler>

The thermosetting resin composition may further contain (f) an inorganic filler.

Examples of the (f) inorganic filler include silica, alumina, titanium oxide, mica, beryllia, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, clay such as fired clay and the like, talc, aluminum borate, silicon carbide, quartz powder, short glass fiber, glass fine powder, hollow glass, and the like. Examples of the glass include E glass, T glass, and D glass. These may be used alone or in combination of two or more kinds.

Among these, silica is preferable from the viewpoints of dielectric properties, heat resistance, and low thermal expansion. Examples of the silica include precipitated silica produced by a wet process and having a high moisture content, and dry-process silica produced by a dry process and containing almost no bound water and the like, and the dry-process silica is further classified into crushed silica, fumed silica, fused spherical silica and the like depending on the difference in the manufacture method. Among these, fused spherical silica is preferable from the viewpoint of low thermal expansion and fluidity when filled in a resin.

The average particle diameter of the (f) inorganic filler is preferably 0.1 to 10 μm, more preferably 0.3 to 8 μm, and still more preferably 0.3 to 3 μm. When the average particle diameter is 0.1 μm or more, the fluidity at the time of highly filling the resin tends to be kept good, and when the average particle diameter is 10 μm or less, the mixing probability of coarse particles is reduced and the occurrence of defects caused by coarse particles tends to be suppressed. Here, the average particle diameter is a particle diameter at a point corresponding to a volume of 50% when the cumulative frequency distribution curve according to the particle diameter is obtained by setting the total volume of the particles to 100%, and can be measured by a particle size distribution measuring apparatus using a laser diffraction scattering method or the like.

The (f) inorganic filler may be surface treated with a coupling agent. The method of surface treatment by the coupling agent may be a method of surface treatment by a dry method or a wet method with respect to the (f) inorganic filler before blending, or a so-called integral blend treatment method in which a silane coupling agent is added to the composition after the surface untreated inorganic filler (f) is blended into another component to form a composition.

Examples of the coupling agent include a silane-based coupling agent, a titanate-based coupling agent, and a silicone oligomer.

When the thermosetting resin composition contains the (f) inorganic filler, the content thereof is preferably 10 to 70% by volume, more preferably 20 to 60% by volume, and still more preferably 30 to 60% by volume in the thermosetting resin composition. When the blending amount of the (f) inorganic filler is within the above range, the moldability and the low thermal expansion tend to be good.

When the thermosetting resin composition contains the (f) inorganic filler, it is preferable to improve the dispersibility of the (f) inorganic filler by performing a treatment with a disperser such as a three-roll, a bead mill, or a nano-mixer, if necessary.

<Other Components>

The thermosetting resin composition contained in the prepreg of the present invention may contain other components such as a flame retardant, an ultraviolet absorber, an antioxidant, a photopolymerization initiator, a fluorescent brightener, an adhesion improving agent, and the like to the extent that the thermosetting property is not impaired.

Examples of the flame retardant include a phosphorus flame retardant such as an aromatic phosphate ester compound, a phosphazene compound, a phosphinic acid ester, a metal salt of a phosphinic acid compound, red phosphorus, 9,10-dihydro-9-oxa-10-phosphaphenanthrene-10-oxide, and a derivative thereof; a nitrogen flame retardant such as guanidine sulfamate, melamine sulfate, melamine polyphosphate, melamine cyanurate; a halogen-containing flame retardant containing bromine, chlorine, and the like; and an inorganic flame retardant such as antimony trioxide.

Examples of the ultraviolet absorber include a benzotriazole-based ultraviolet absorber.

Examples of the antioxidant include a hindered phenol antioxidant, a hindered amine antioxidant, and the like.

Examples of the photopolymerization initiator include benzophenone, benzylketal, thioxanthone, and the like.

Examples of the fluorescent brightener include a fluorescent brightener of a stilbene derivative.

Examples of the adhesion improving agent include urea compounds such as urea silane, and the coupling agent.

The thermosetting resin composition may be in the form of a varnish in which each component is dissolved or dispersed in an organic solvent so as to be easily used for manufacturing a prepreg or the like.

Examples of the organic solvent include an alcohol-based solvent such as methanol, ethanol, propanol, butanol, methyl cellosolve, butyl cellosolve, propylene glycol monomethyl ether, and the like; a ketone-based solvent such as acetone, methyl ethyl ketone, methyl isobutyl ketone, cyclohexanone, and the like; an ester-based solvent such as butyl acetate, propylene glycol monomethyl ether acetate, and the like; an ether-based solvent such as tetrahydrofuran and the like; an aromatic solvent such as toluene, xylene, mesitylene, and the like; a nitrogen atom-containing solvent such as dimethylformamide, dimethylacetamide, N-methylpyrrolidone, and the like; and a sulfur atom-containing solvent such as dimethyl sulfoxide and the like. These organic solvents may be used alone or in combination of two or more kinds.

Among these, methyl ethyl ketone, methyl isobutyl ketone, cyclohexanone, methyl cellosolve, and propylene glycol monomethyl ether are preferable from the viewpoint of solubility of each component, methyl ethyl ketone is more preferable, and methyl isobutyl ketone, cyclohexanone, and propylene glycol monomethyl ether are more preferable from the viewpoint of low toxicity.

The solid content concentration of the varnish is preferably 40 to 90% by mass, more preferably 50 to 80% by mass. When the solid content concentration of the varnish is within the above-mentioned range, the coating property can be kept good, and a prepreg having an appropriate adhesion amount of the thermosetting resin composition can be obtained.

The prepreg of the present invention can be manufactured, for example, by impregnating the thermosetting resin composition into a fiber base material and semi-curing (B-staging) by heating or the like.

As the fiber base material, well-known materials used for various laminates for electrically insulating materials can be used. Examples of the material include inorganic fibers such as E glass, S glass, low dielectric glass, and Q glass; organic fibers such as low dielectric glass polyimide, polyester, and tetrafluoroethylene; and mixtures thereof. In particular, from the viewpoint of obtaining a base material having excellent dielectric properties, inorganic fibers are preferable, and low dielectric glass and Q glass are more preferable.

The fiber base material has, for example, a shape of woven fabric, nonwoven fabric, roving, chopped strand mat, surfacing mat, and the like.

The material and shape of the fiber base material are appropriately selected depending on the object use and performance of the molded article, and may be a fiber base material of one kind of material and one kind of shape, a fiber base material of two or more kinds, or a fiber base material having two or more kinds of shapes, as necessary. The fiber base material may be, for example, about 30 to 500 μm thick. The thickness of the fiber base material is preferably 30 to 200 μm, and more preferably 50 to 150 μm from the viewpoint of low warpage and high-density wiring. From the viewpoints of heat resistance, moisture resistance, processability, and the like, it is preferable that the fiber base material is surface-treated with a silane coupling agent or the like, and are mechanically subjected to a fiber opening treatment.

In the prepreg of the present invention, for example, it is preferable that the amount of adhering the solid content of the thermosetting resin composition to the fiber base material is 20 to 90% by mass in terms of the content of the thermosetting resin composition to the prepreg after drying.

The prepreg of the present invention can be manufactured, for example, by impregnating a thermosetting resin composition into a fiber base material so that the amount of solid content adhered of the thermosetting resin composition in the prepreg falls within the above range, followed by heating and drying at a temperature of 100 to 200° C. for 1 to 30 minutes, and semi-curing (B-staging).

[Coreless Substrate]

The coreless substrate of the present invention contains an insulating layer formed using the prepreg for a coreless substrate of the present invention.

The coreless substrate of the present invention can be manufactured by, for example, a method of forming a build-up layer on a support (core substrate) using the prepreg of the present invention, and then separating the support. The method of forming the build-up layer is not particularly limited, and a known method can be employed. For example, the build-up layer can be formed by the following method (see FIG. 1).

Figure 1:
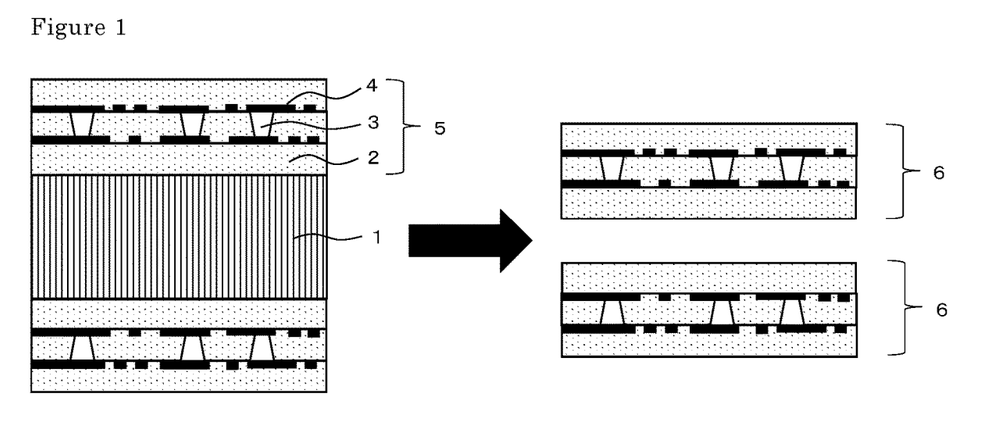
FIG. 1 is a schematic view illustrating one embodiment of the method for manufacturing a coreless substrate of the present invention.

As shown in FIG. 1, first, a prepreg 2 of the present invention is disposed on a support (core substrate) 1. The prepreg 2 may be disposed on the support (core substrate) 1 after disposing an adhesive layer. Thereafter, the prepreg 2 is heated and cured to form an insulating layer. Next, after the via hole 3 is formed by a drilling method, a laser processing method using a YAG laser, a $CO_2$ laser, or the like, a surface roughening treatment and a desmear treatment are performed as required. Subsequently, a circuit pattern 4 is formed by a subtractive method, a full additive method, a semi-additive method (SAP: Semi Additive Process), a modified semi-additive method (m-SAP: modified Semi Additive Process), or the like. By repeating the above process, a build-up layer 5 is formed. A coreless substrate is obtained by separating the formed build-up layer 5 from the support (core substrate) 1. The build-up layer 5 may be formed on one surface of the support (core substrate) 1, or may be formed on both surfaces of the support (core substrate) 1.

Examples of the support (core substrate) include a known support (core substrate) such as a so-called glass epoxy material containing a glass cloth and an epoxy resin.

The coreless substrate of the present invention includes one or more insulating layers obtained by curing the prepreg of the present invention, and may include insulating layers obtained by curing a prepreg, a resin film, or the like other than the prepreg of the present invention.

Since the coreless substrate of the present invention does not have a core substrate, the thickness of the coreless substrate is usually small, specifically, 15 to 700 μm is preferable, 30 to 600 μm is more preferable, and 35 to 500 μm is further preferable.

[Semiconductor Package]

The semiconductor package of the present invention is formed by mounting a semiconductor element on a coreless substrate of the present invention, and is manufactured by mounting a semiconductor element such as a semiconductor chip or a memory on a predetermined position of the coreless substrate. The semiconductor element may be sealed on the coreless substrate by a sealing material.

EXAMPLES

The present invention is now explained in more detail by the following examples, which do not limit the invention. The performance of a copper clad laminate (coreless substrate) produced using the prepreg for a coreless substrate obtained in each example was measured and evaluated by the following method.

(1) Glass Transition Temperature (Tg)

By removing the copper foil by immersing the copper clad laminate in a copper etchant, an evaluation substrate having a length (X direction) of 5 mm×a width (Y direction) of 5 mm×a thickness (Z direction) of 0.15 mm was produced, and the evaluation substrate was subjected to thermomechanical analysis by a compression method using a TMA test device (manufactured by DuPont Corporation, trade name: TMA2940). After mounting the evaluation substrate to the device in the X-direction, the substrate was measured twice in succession under measurement condition including a load of 5 g and a temperature increasing rate of 10° C./min. The Tg indicated by the intersection of the different tangents of the thermal expansion curves in the second measurement was determined and used as an index of heat resistance. The higher the Tg, the better the heat resistance.

(2) Thermal Expansion Ratio

By removing the copper foil by immersing the copper clad laminate in a copper etchant, an evaluation substrate having a length (X direction) of 5 mm×a width (Y direction) of 5 mm×a thickness (Z direction) of 0.15 mm was produced, and the evaluation substrate was subjected to thermomechanical analysis by a compression method using a TMA test device (manufactured by DuPont Corporation, trade name: TMA2940). After mounting the evaluation substrate to the device in the X-direction, the substrate was measured twice in succession under measurement condition including a load of 5 g and at a temperature increasing rate of 10° C./min. The average coefficient of thermal expansion from 30° C. to 100° C. in the second measurement was calculated, and this was used as the value of the coefficient of thermal expansion.

(3) Copper Foil Bonding Strength (Copper Foil Peel Strength)

By immersing the copper clad laminate in a copper etchant, an evaluation substrate was produced in which the copper foil was removed while leaving a band portion (circuit layer) having a width of 3 mm as a copper foil peel strength measurement portion. One end of the band portion was peeled off at the interface between the circuit layer and the insulating layer, and was then grasped by a grabber, and the bonding strength (peel strength) of the copper foil was measured by using a tensile tester at a pulling speed of about 50 mm/min in the vertical direction and peeling at room temperature. The greater the value, the greater the bonding strength with the copper foil (metal circuit), and for coreless substrates, 0.50 kN/m or more is preferable, and 0.55 kN/m or more is more preferable.

(4) Flexural Modulus

The copper foil was removed by immersing the copper clad laminate in a copper etchant to prepare an evaluation substrate of 50 mm×25 mm, and the flexural modulus of the evaluation substrate was measured using a universal testing machine "Tensilon UCT-5T" (manufactured by Orientech Co., Ltd.) at a crosshead speed of 1 mm/min and a span-to-span distance of 20 mm. The higher the value, the higher the rigidity.

(5) Desmear Weight Loss

Figure 2:
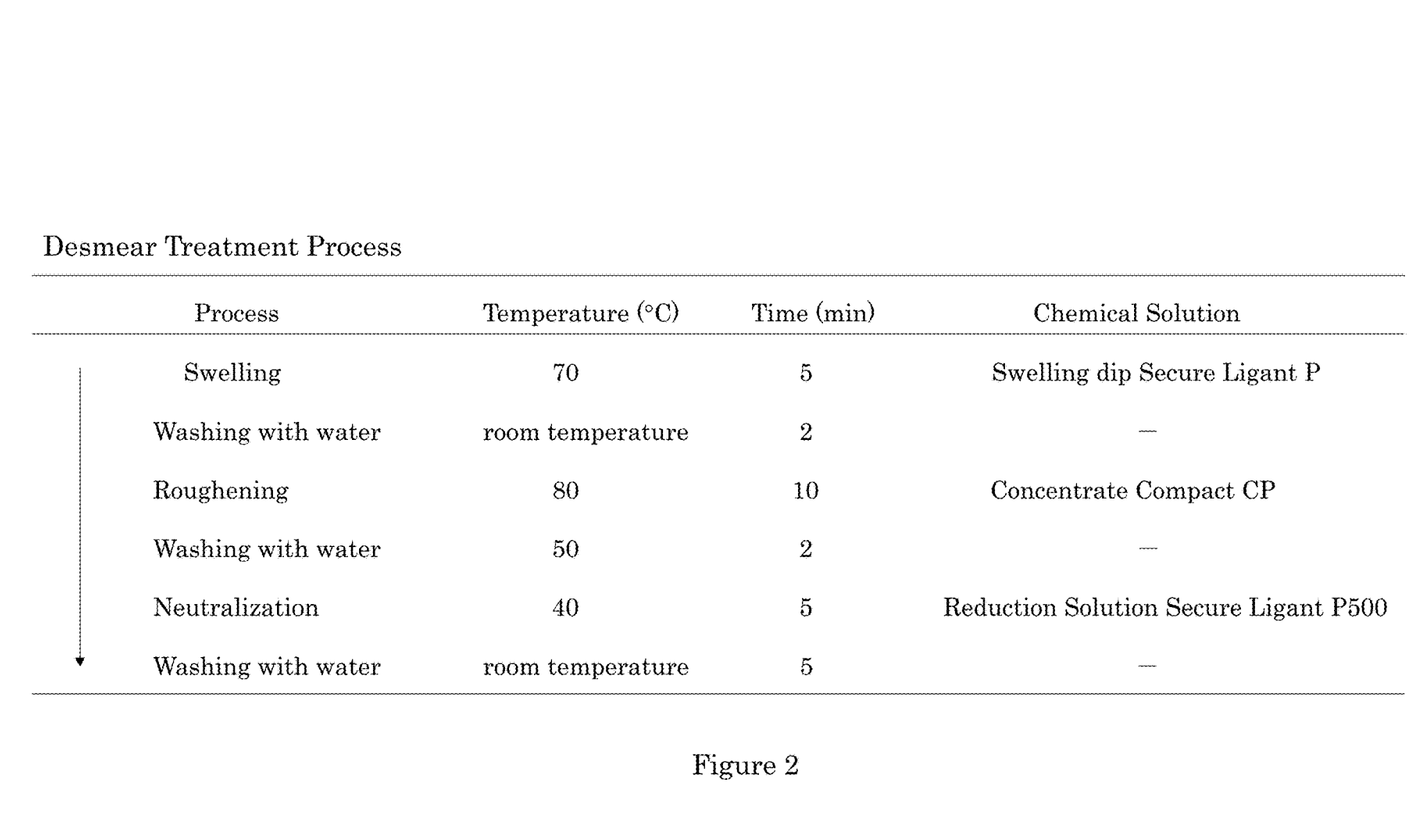
FIG. 2 is a flow diagram of a desmear treatment process.

The copper foil was removed by immersing the copper clad laminate in a copper etchant to prepare an evaluation substrate of 40 mm×40 mm, which was then desmeared by the process shown in FIG. 2. The chemicals listed in FIG. 2 are all manufactured by Attec Japan K.K. The weight reduction amount after desmear treatment relative to the dry weight before desmear treatment was calculated, and this was used as an index of desmear resistance. The smaller the value, the better the desmear resistance.

Preparation Example 1

Preparation of (X-i) Siloxane-Modified Polyimide

A reaction vessel with a heating and cooling capacity of 2 liters equipped with a thermometer, a stirrer, and a water analyzer with a refluxing cooling tube was charged with 72 g of both-end diamine-modified siloxanes (manufactured by Shin-Etsu Chemical Co., Ltd., trade name: X-22-161A, functional group equivalent of amino group: 800 g/mol, component (c)), 252 g of bis(4-maleimidophenyl)methane (manufactured by K. I. Chemical Industry Co., Ltd., trade name: BMI, component (d)), and 270 g of propylene glycol monomethyl ether, and reacted at 110° C. for 3 hours to obtain a solution containing (X-i) siloxane-modified polyimide.

Preparation Example 2

Preparation of (X-ii) Siloxane-Modified Polyimides

In a reaction vessel with a heating and cooling capacity of 2 liters equipped with a thermometer, a stirrer, and a water analyzer with a refluxing cooling tube, 72 g of both-end diamine-modified siloxanes (manufactured by Shin-Etsu Chemical Co., Ltd., trade name: X-22-161B, functional group equivalent of amino group: 1,500 g/mol, component (c)), 252 g of bis(4-maleimidophenyl)methane (manufactured by K. I. Chemical Industry Co., Ltd., trade name: BMI, component (d)), and 270 g of propylene glycol monomethyl ether were put in, and reacted at 110° C. for 3 hours to obtain a solution containing (X-ii) siloxane-modified polyimide.

Examples 1 to 12 and Comparative Examples 1 to 6

The following components were mixed at the mixing ratio shown in Table 2 (in the case of a solution, the amount was calculated as solid content), and a varnish having a solid content concentration of 65% by mass was prepared by using methyl ethyl ketone as a solvent. Next, this varnish was impregnated and coated on an E glass cloth having a thickness of 0.1 mm, and heated and dried at 160° C. for 10 minutes to obtain a prepreg for a coreless substrate having a content of a curable resin composition of 48% by mass.

Four prepregs for coreless substrates were stacked, 12-μm electrolytic copper foils were placed up and down, and pressed at 2-5 MPa with a temperature of 240° C. for 60 minutes to obtain a copper clad laminate. The evaluation results of the obtained copper clad laminate obtained according to the above measurement method are shown in Table 2.

[Component of Thermosetting Resin Composition]

[(a) dicyandiamide]

Dicyandiamide (manufactured by Wako Pure Chemical Industries, Ltd.)

[(b) Adducts of Tertiary Phosphines and Quinones]

(b-i) An adduct of triphenylphosphine and p-benzoquinone (b-ii) An adduct of tri(p-tolyl)phosphines and p-benzoquinones (b-iii) An adduct of tri(n-butyl)phosphine and p-benzoquinone

[(X) Siloxane-Modified Polyimide]

(X-i) Solution containing (X-i) siloxane-modified polyimide prepared in Preparation Example 1

(X-ii) Solution containing (X-ii) siloxane-modified polyimide prepared in Preparation Example 2

[(e) Thermosetting Resin]

(e-i) NC-7000-L: α-naphthol/cresol novolac type epoxy resin (manufactured by Nippon Kayaku Co., Ltd., trade name)

(e-ii) NC-3000-H: Biphenylalalkylnovolac type epoxy resin (manufactured by Nippon Kayaku Co., Ltd., trade name)

(f) Inorganic Filler

Spherical fused silica (mean particle size: 0.5 μm)

TABLE 2

| | | | Examples | | | | | | | | | | |
|---|---|---|---|---|---|---|---|---|---|---|---|---|---|
| | | | 1 | 2 | 3 | 4 | 5 | 6 | 7 | 8 | 9 | 10 | 11 |
| Component (a) | Dicyandiamide | Parts by mass | 0.1 | 0.1 | 0.1 | 0.3 | 0.3 | 0.3 | 0.5 | 0.5 | 0.5 | 0.1 | 0.1 |
| Component (b) | (b-i) Adduct of PPh$_3$ and p-benzoquinone | Parts by mass | 0.3 | | | 0.3 | | | 0.3 | | | 0.3 | 0.3 |
| | (b-ii) Adduct of P(p-tol)$_3$ and p-benzoquinone | Parts by mass | | 0.3 | | | 0.3 | | | 0.3 | | | |
| | (b-iii) Adduct of P(n-Bu)$_3$ and p-benzoquinone | Parts by mass | | | 0.3 | | | 0.3 | | | 0.3 | | |
| (X) Amino-modified polyimide resin | (X-i) Preparation Example 1 | Parts by mass | 90 | 90 | 90 | 90 | 90 | 90 | 90 | 90 | 90 | 90 | |
| | (X-ii) Preparation Example 2 | Parts by mass | | | | | | | | | | | 90 |
| Component (e) | (e-i) NC-7000-L | Parts by mass | 10 | 10 | 10 | 10 | 10 | 10 | 10 | 10 | 10 | | 10 |
| | (e-ii) NC-3000-H | Parts by mass | | | | | | | | | | 10 | |
| Component (f) | Spherical fused silica | Vol %$_{*1}$ | 45 | 45 | 45 | 45 | 45 | 45 | 45 | 45 | 45 | 45 | 45 |
| Results of the evaluations | (1) Glass transition temperature (° C.) | | 270 | 275 | 270 | 270 | 270 | 275 | 275 | 275 | 270 | 275 | 280 |
| | (2) Coefficient of thermal expansion (ppm/° C.) | | 7.8 | 7.6 | 7.7 | 7.8 | 7.8 | 7.7 | 7.9 | 7.8 | 7.7 | 7.5 | 7.3 |
| | (3) Copper-foil bonding strength (kN/m) | | 0.55 | 0.58 | 0.6 | 0.62 | 0.64 | 0.64 | 0.64 | 0.63 | 0.66 | 0.58 | 0.6 |
| | (4) Flexural modulus (GPa) | | 18 | 18.1 | 18.3 | 18.4 | 18.3 | 18.2 | 18.6 | 18.4 | 18.5 | 18.6 | 18.2 |
| | (5) Desmear Weight Loss (g/m$^2$) | | 2.5 | 2.3 | 2.3 | 2.4 | 2.2 | 2.5 | 2.2 | 2.5 | 2.6 | 2.4 | 2.2 |

| | | | Examples | Comparative example | | | | | |
|---|---|---|---|---|---|---|---|---|---|
| | | | 12 | 1 | 2 | 3 | 4 | 5 | 6 |
| Component (a) | Dicyandiamide | Parts by mass | 0.1 | 0 | 0 | 0 | 0 | 0 | 0 |
| Component (b) | (b-i) Adduct of PPh$_3$ and p-benzoquinone | Parts by mass | 0.3 | 0.3 | | | 0.3 | 0.3 | 0.3 |
| | (b-ii) Adduct of P(p-tol)$_3$ and p-benzoquinone | Parts by mass | | | 0.3 | | | | |
| | (b-iii) Adduct of P(n-Bu)$_3$ and p-benzoquinone | Parts by mass | | | | 0.3 | | | |
| (X) Amino-modified polyimide resin | (X-i) Preparation Example 1 | Parts by mass | | 90 | 90 | 90 | 90 | | 90 |
| | (X-ii) Preparation Example 2 | Parts by mass | 90 | | | | | 90 | |
| Component (e) | (e-i) NC-7000-L | Parts by mass | | 10 | 10 | 10 | 10 | 10 | |
| | (e-ii) NC-3000-H | Parts by mass | 10 | | | | | | 10 |
| Component (f) | Spherical fused silica | Vol %$_{*1}$ | 45 | 45 | 45 | 45 | 45 | 45 | 45 |

TABLE 2-continued

| | | | | | | | | |
|---|---|---|---|---|---|---|---|---|
| Results of the evaluations | (1) Glass transition temperature (° C.) | 285 | 270 | 270 | 275 | 275 | 285 | 275 |
| | (2) Coefficient of thermal expansion (ppm/° C.) | 7.2 | 7.8 | 7.6 | 7.7 | 7.7 | 7.4 | 7.7 |
| | (3) Copper-foil bonding strength (kN/m) | 0.6 | 0.45 | 0.43 | 0.45 | 0.48 | 0.46 | 0.46 |
| | (4) Flexural modulus (GPa) | 18 | 17.8 | 17.9 | 17.8 | 17.9 | 17.6 | 17.8 |
| | (5) Desmear Weight Loss (g/m$^2$) | 2.5 | 2.6 | 2.4 | 2.5 | 2.3 | 2.3 | 2.5 |

*1 The volume % in the thermosetting resin composition is shown.

As shown in Table 2, Examples 1 to 12 are excellent in heat resistance, low thermal expansion, and copper foil bonding strength, high in flexural modulus, and small in desmear weight loss. In particular, the copper foil bonding strength is further excellent, and the flexural modulus is also improved.

On the other hand, in Comparative Examples 1 to 6 in which (a) dicyandiamide is not used, none of them simultaneously satisfy all the characteristics of heat resistance, low thermal expansion, and copper foil bonding strength, and in particular, they are inferior in copper foil bonding strength. In addition, the flexural modulus is also somewhat lower.

Therefore, the prepreg of the present invention obtained in the embodiments is very useful for a coreless substrate because it satisfies the levels of heat resistance, low thermal expansion and bonding strength with a metal circuit required for the coreless substrate.

INDUSTRIAL APPLICABILITY

Since the prepreg of the present invention satisfies the level of heat resistance, low thermal expansion, and bonding strength with a metal circuit required for a coreless substrate, it is suitable for manufacturing a printed wiring board with high density and high multilayers, and is suitable for use in wiring boards of electronic equipment such as computers and information equipment terminals for processing large amounts of data at high speed.

REFERENCE SIGNS LIST

1 Support (core substrate)
2 Prepreg (insulating layer)
3 Via hole
4 Circuit pattern
5 Build-up layer
6 Coreless substrate

The invention claimed is:

1. A prepreg for a coreless substrate, comprising a thermosetting resin composition and a fiber base material,
wherein the thermosetting resin composition contains (a) dicyandiamide, (b) an adduct of a tertiary phosphine and quinones, (c) an amine compound having at least two primary amino groups, and (d) a maleimide compound having at least two N-substituted maleimide groups, and the component (c) comprises both-terminal diamine-modified siloxane.

2. The prepreg for a coreless substrate according to claim 1, wherein a content of the (a) dicyandiamide is 0.05 to 1.5 parts by mass with respect to 100 parts by mass of a solid content of a resin component in the thermosetting resin composition.

3. The prepreg for a coreless substrate according to claim 1, wherein the thermosetting resin composition further contains at least one (e) thermosetting resin selected from the group consisting of an epoxy resin and a cyanate resin.

4. The prepreg for a coreless substrate according to claim 1, wherein the thermosetting resin composition further contains (f) an inorganic filler.

5. A coreless substrate comprising an insulating layer comprising the prepreg for a coreless substrate according to claim 1.

6. A semiconductor package comprising a semiconductor element mounted on the coreless substrate according to claim 5.

7. A prepreg for a coreless substrate, comprising a thermosetting resin composition and a fiber base material,
wherein the thermosetting resin composition contains (a) dicyandiamide, (b) an adduct of a tertiary phosphine and quinones, and (X) an amino-modified polyimide resin, wherein the (X) amino-modified polyimide resin is a reaction product of (c) an amine compound having at least two primary amino groups in its molecular structure and (d) a maleimide compound having at least two N-substituted maleimide groups in its molecular structure, and the component (c) comprises both-terminal diamine-modified siloxane.

8. The prepreg for a coreless substrate according to claim 7, wherein a content of the (a) dicyandiamide is 0.05 to 1.5 parts by mass with respect to 100 parts by mass of a solid content of a resin component in the thermosetting resin composition.

9. The prepreg for a coreless substrate according to claim 7, wherein the thermosetting resin composition further contains at least one (e) thermosetting resin selected from the group consisting of an epoxy resin and a cyanate resin.

10. The prepreg for a coreless substrate according to claim 7, wherein the thermosetting resin composition further contains (f) an inorganic filler.

11. A coreless substrate comprising an insulating layer comprising the prepreg for a coreless substrate according to claim 7.

12. A semiconductor package comprising a semiconductor element mounted on the coreless substrate according to claim 11.

* * * * *